United States Patent [19]

Kakoschke

[11] Patent Number: 4,981,815
[45] Date of Patent: Jan. 1, 1991

[54] METHOD FOR RAPIDLY THERMALLY PROCESSING A SEMICONDUCTOR WAFER BY IRRADIATION USING SEMICIRCULAR OR PARABOLIC REFLECTORS

[75] Inventor: Ronald Kakoschke, Munich, Fed. Rep. of Germany

[73] Assignee: Siemens Aktiengesellschaft, Berlin and Munich, Fed. Rep. of Germany

[21] Appl. No.: 322,113

[22] Filed: Mar. 13, 1989

[30] Foreign Application Priority Data

May 9, 1988 [DE] Fed. Rep. of Germany ....... 3815836

[51] Int. Cl.$^5$ ..................... H01L 21/00; H01L 21/02; H01L 21/20; H01L 21/263
[52] U.S. Cl. .................................... 437/173; 437/174; 437/247; 437/248; 437/942; 118/620; 219/405; 148/DIG. 4
[58] Field of Search ............... 437/173, 174, 247, 248, 437/82, 942; 148/DIG. 71, DIG. 4; 118/620, 621, 623; 219/10.55 R, 85 BA, 85 BM, 339, 354, 405, 411; 432/31

[56] References Cited

U.S. PATENT DOCUMENTS

| | | | |
|---|---|---|---|
| 3,627,590 | 12/1971 | Mammel | 437/82 |
| 3,763,348 | 10/1973 | Costello | 219/347 |
| 4,101,759 | 7/1978 | Anthony et al. | 219/343 |
| 4,113,547 | 9/1978 | Katz et al. | 427/45 |
| 4,115,163 | 9/1978 | Gorina et al. | 250/492 |
| 4,468,259 | 8/1984 | Mimura | |
| 4,469,529 | 9/1984 | Mimura | 427/55 |
| 4,888,302 | 12/1989 | Ramesh | 437/942 |

FOREIGN PATENT DOCUMENTS

| | | | |
|---|---|---|---|
| 3136105 | 4/1982 | Fed. Rep. of Germany . | |
| 0135630 | 8/1983 | Japan | 437/942 |
| 0289620 | 12/1986 | Japan . | |
| 2060998 | 5/1981 | United Kingdom | 437/942 |
| 2065973 | 7/1981 | United Kingdom . | |
| 2070327 | 9/1981 | United Kingdom | 437/942 |

OTHER PUBLICATIONS

Akiyama, N., Critical Radial Temperature Gradient Inducing Slip Dislocations in Silicon Epitaxy Using Dual Heating of the Two Surfaces of a Wafer, Japan, Journal of Appl. Phys., vol. 25, No. 11, Nov. 1986, pp. 1619–1622.

Sakurai J., Focused Lamp Zone Melting Recrystallization of Silicon on Insulating Substrate J. Electrochem. Soc.: Sol.-State Sci. and Tech., vol. 133, No. 7, Jul. 1986, pp. 1485–1488.

Wolf, S., Silicon Processing for the VLSI Era, vol. 1, p. 367, Lattice Press, 1986.

Peak Systems, Inc. 4258 Solar Way, Fremont, Calif. ALP 6000.

Varian Entitled RTP-8000 Rapid Thermal Processor Extrion Division.

Japanese Journal of Applied Physics vol. 25, No. 11, Nov. 1986, pp. 1619–1622 entitled "Critical Radial Temperature Gradient Inducing Slip Dislocations in Silicon Epitaxy Using Dual Heating of the Two Surfaces of Wafer".

Primary Examiner—Brian E. Hearn
Assistant Examiner—B. Everhart
Attorney, Agent, or Firm—Hill, Van Santen, Steadman & Simpson

[57] ABSTRACT

A method for rapidly thermal processing a semiconductor wafer (1) by irradiation with electromagnetic radiation which provides that the majority portion of the energy required for heating the semiconductor wafer (1) is transmitted with at least single-sided irradiation of the semiconductor wafter (1) with electromagnetic radiation from a main irradiation arrangement (62) and the intensities ($I_M$, $I_R$) of the radiation directed onto the central region (6) and of the radiation directed onto the edge regions (5) are identical. The temperatures in the central region (6) and in the edge regions (5) of the semiconductor wafer (1) are maintained identical during the entire tempering process in order to increase the yield, and an additional electromagnetic radiation is directed onto the edge region (5) of the semiconductor wafer for compensating for the radiation of heat occurring faster at the edge region (5) of the semiconductor wafer (1).

The method improves rapid thermal processing methods in the manufacture of integrated semiconductor circuits.

10 Claims, 7 Drawing Sheets

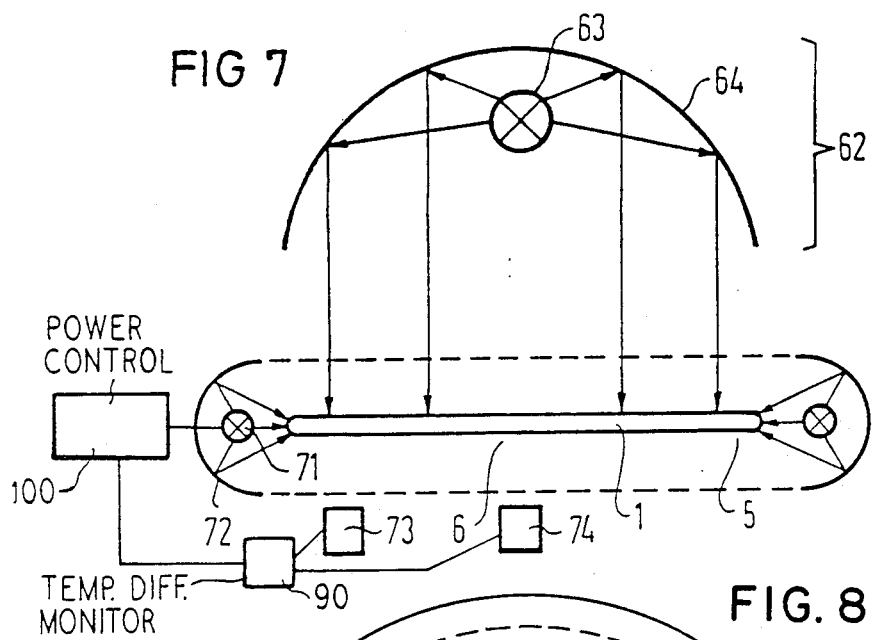
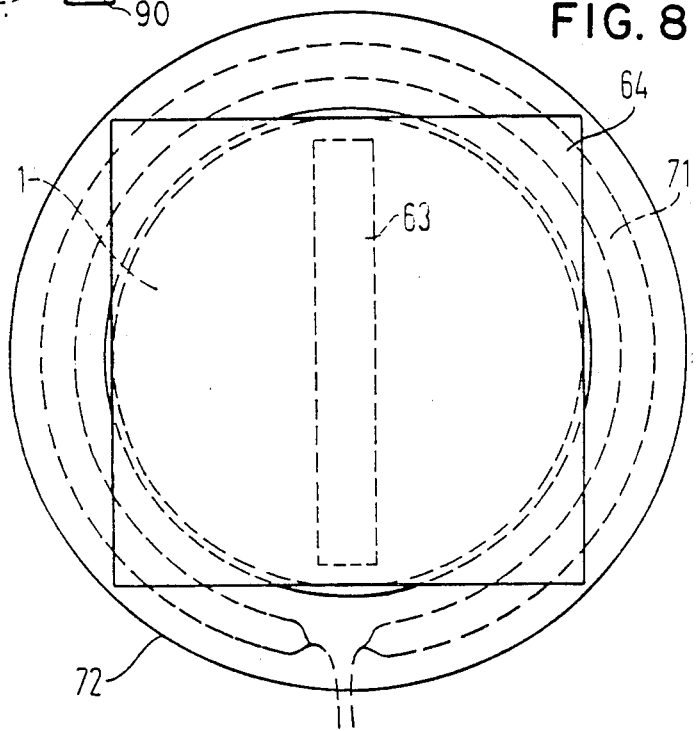

METHOD FOR RAPIDLY THERMALLY PROCESSING A SEMICONDUCTOR WAFER BY IRRADIATION USING SEMICIRCULAR OR PARABOLIC REFLECTORS

BACKGROUND OF THE INVENTION

1. Field of the Invention

This invention is directed to a method and apparatus for rapidly thermally processing a semiconductor wafer using electromagnetic radiation with a main irradiation arrangement which comprises at least one main irradiation source which transmits the majority part of the energy required for heating the semiconductor wafer and may have one or more secondary radiation sources and/or reflectors.

2. Description of Related Art

Rapid thermal processing methods are gaining in importance in the manufacture of electronic components on semiconductor wafers. The semiconductor wafers are individually introduced into a process chamber and are then very quickly and, insofar as possible, uniformly heated in a defined atmosphere, for example, by irradiation from an intense light source. The temperature is generally measured with a pyrometer at a measuring point in the center of the wafer. The signal from the pyrometer is to control the power to the heating lamps to control the intensity of the light so that a prescribed temperature-time cycle is produced with optimum precision. A typical temperature-time cycle for curing ion implantations is, for example, a heating rate of 300° C. per second up to 1100° C., a steady stage duration of 10s, and then a cooling rate of 100° C. per second.

A prerequisite for achieving high yields in rapid thermal processing is to maintain an adequately uniform temperature distribution over the entire semiconductor wafer. Particularly with semiconductor wafers which have large diameters, however, this represents a problem which has not as yet been satisfactorily solved.

FIG. 1 shows a semiconductor wafer which has an upper side 2 which is irradiated over its surface with electromagnetic radiation 3 of uniform intensity. Due to the heat emission 4 which occurs at an increased amount at the edges 5 of the semiconductor wafer 1, a lower temperature will result at the edges 5 of the semiconductor wafer 1 than that which exists in the center 6 of the semiconductor wafer 1.

FIG. 2 illustrates the curve of the intensity $I_M$ of the radiation at the center 6 of the semiconductor wafer 1 and the curve of the intensity $I_R$ of the radiation at the edges 5 of the semiconductor wafer 1 and these are identical in this case. FIG. 2 also shows the curve of the temperature $T_M$ at the center 6 of the semiconductor wafer 1 and the temperature $T_R$ at the edges 5 of the semiconductor wafer during a tempering or annealing process which has a heating-up phase $t_1$ and a tempering or annealing phase $t_2$. It may be seen from the curves of FIG. 2 that a uniform intensity distribution of the irradiation over the semiconductor wafer results in a non-uniform temperature distribution because due to the additional area at the edges 5 of the semiconductor wafer, the radiation of heat at the edges increases over the radiation at the center.

The prior art will also be discussed with reference to FIGS. 3 and 4.

FIG. 3 shows a semiconductor wafer 1 in which the edge regions 5 are irradiated with increased intensity relative to the center 6 of the semiconductor wafer 1. The intensity distribution of the irradiation is schematically indicated by arrows which differ in width to show this variation. Methods based on this principle are employed for improving the temperature distribution in the known rapid thermal processing systems, as for example discussed in the publications of Varian GmbH, D-7000 Stuttgart-Vaihingen, Brochure No. VAC 6057 and of the Peak Systems Incorporated, Fremont, USA, ALP 6000, of May 1986. The relationship of the intensity $I_M$ at the center 6 of the semiconductor wafer 1 to the intensity $I_R$ at the edges 5 of the semiconductor wafer is maintained constant during the tempering or annealing phase $t_2$.

FIG. 4 shows the curve of the intensity $I_M$ of the irradiation at the center 6 of the semiconductor wafer 1 and the intensity $I_R$ of the irradiation at the edges 5 of the semiconductor wafer, and also shows the curve of the temperature $T_M$ in the center 6 of the semiconductor wafer and the temperature $T_R$ at the edges 5 of the semiconductor wafer during a tempering or annealing process having a heating-up phase $t_1$ and a tempering or annealing phase $t_2$.

The irradiation power is controlled by using pyrometer measurements in the center 6 of the semiconductor wafer so that a prescribed temperature-time cycle $T_M(t)$ is maintained in the center 6 of the wafer. During the heating-up phase $t_1$, radiation is carried out with extremely high intensities $I_M$ and $I_R$, and the edges 5 of the semiconductor wafer are irradiated by more energy than the center and are more rapidly heated.

When the center 6 of the semiconductor wafer has reached the desired temperature $T_S$, the temperature at the edges 5 of the semiconductor wafer are noticeably higher because of the higher energy which has been applied to the edges. A uniform temperature distribution at the rated value $T_S$ is established after some time delay during the tempering phase $t_2$ due to the constant intensity relationship $I_M/I_R$. During the cooling phase $t_3$ after the irradiation is shut off, the edges 5 of the semiconductor wafer then cool more rapidly than the center 6 of the semiconductor wafer.

As a consequence of this dynamic behavior, the temperature-time curve $T_R(t)$ at the edges 5 of the semiconductor wafer thus differ from the temperature-time curve $T_M(t)$ at the center 6 of the semiconductor wafer. The time until the uniform temperature distribution in the stationary tempering phase has been reached is dependent on the mass of the semiconductor wafer 1 and upon the value of the rated temperature $T_S$. For example, it is 5 to 10 seconds for a semiconductor wafer which has a diameter of 6 inches and for a rated temperature $T_S$ of 1100° C. With short tempering times of, for example, 5 seconds, regions at the edges 5 of the semiconductor wafer can have a temperature which is up to 50° C. higher on the average than regions in the center 6 of the semiconductor wafer. This difference becomes even larger for shorter tempering times.

In the prior art methods the inherent advantage of rapid thermal processing rapid heat-up rates and short dwell times at high temperatures, cannot be fully exploited because of the temperature non-uniformity which limits the yield. This has an unfavorable effect specifically on large semiconductor wafers with diameters of 6 inches or more that are common in the production of electronic components which are fabricated on a silicon base.

The temperature non-uniformity caused by the dynamic behavior is not solved by any known rapid thermal processing methods of the prior art.

SUMMARY OF THE INVENTION

It is therefore an object of the invention to provide a method and apparatus for rapid thermal processing of a semiconductor wafer by irradiation which allows tempering processes which produce a uniform temperature distribution over the semiconductor wafer during the entire tempering process.

In a method of the invention this object is achieved by providing (a) a main irradiation arrangement which irradiates the semiconductor wafer on at least one side with the intensities of the radiation which is directed onto the central region of the semiconductor wafer and the irradiation directed onto the region of the edges of the semiconductor wafer are identical; and (b) for compensating for the radiation of heat which occurs higher at the edges of the semiconductor wafer, an electromagnetic radiation which heats the semiconductor wafer is additionally directed onto the edge regions, and the intensity is varied as a function of time such that the temperatures in the central region and in the edge regions of the semiconductor wafer are identical during the entire tempering process.

Other objects, features, and advantages of the invention will become apparent from the following description and claims when read in view of the drawings, in which

BRIEF DESCRIPTION OF THE DRAWINGS

FIG. 7 illustrates in section a modified form of the invention;

FIG. 8 is a plan view of the apparatus of FIG. 7;

DESCRIPTION OF THE PREFERRED EMBODIMENTS

Figure 1:
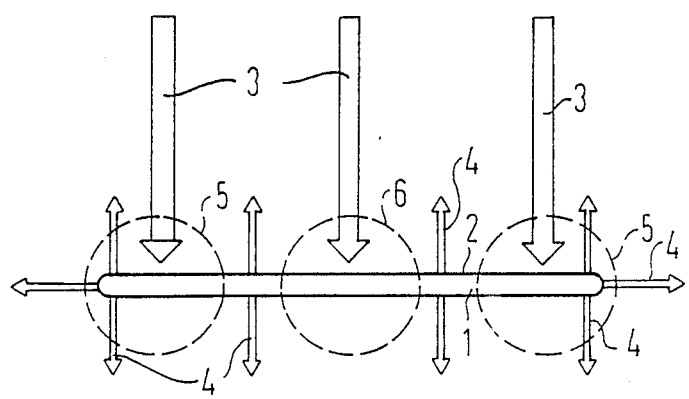
FIG. 1 illustrates irradiation of semiconductor wafer.
Figure 3:
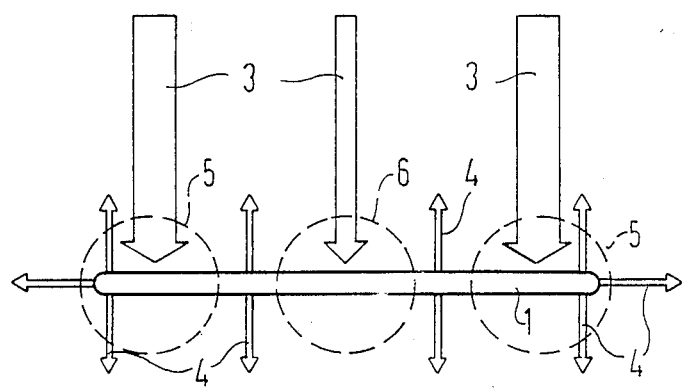
FIG. 3 illustrates another irradiation pattern.
Figure 2:
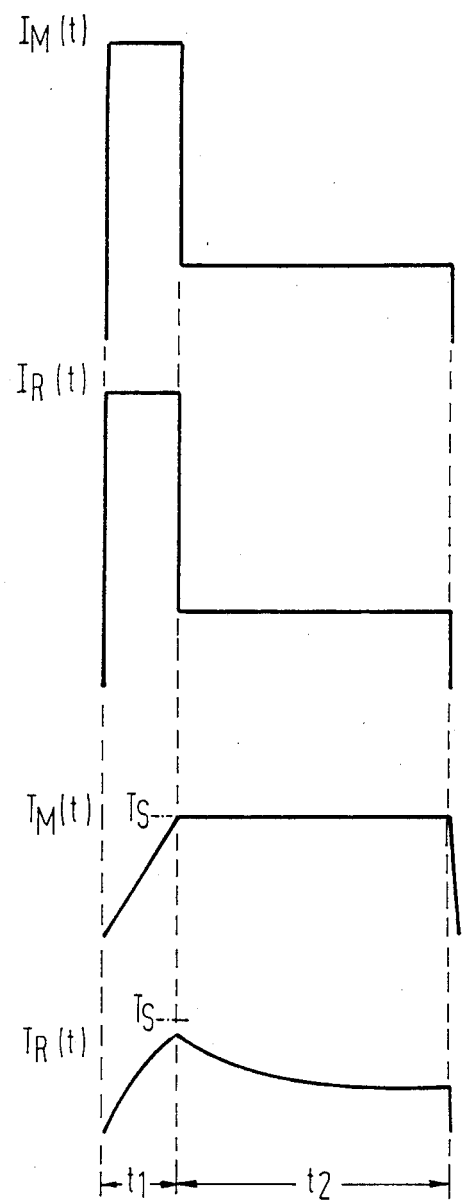
FIG. 2 comprises curves plotted against time showing intensity and temperature.
Figure 4:
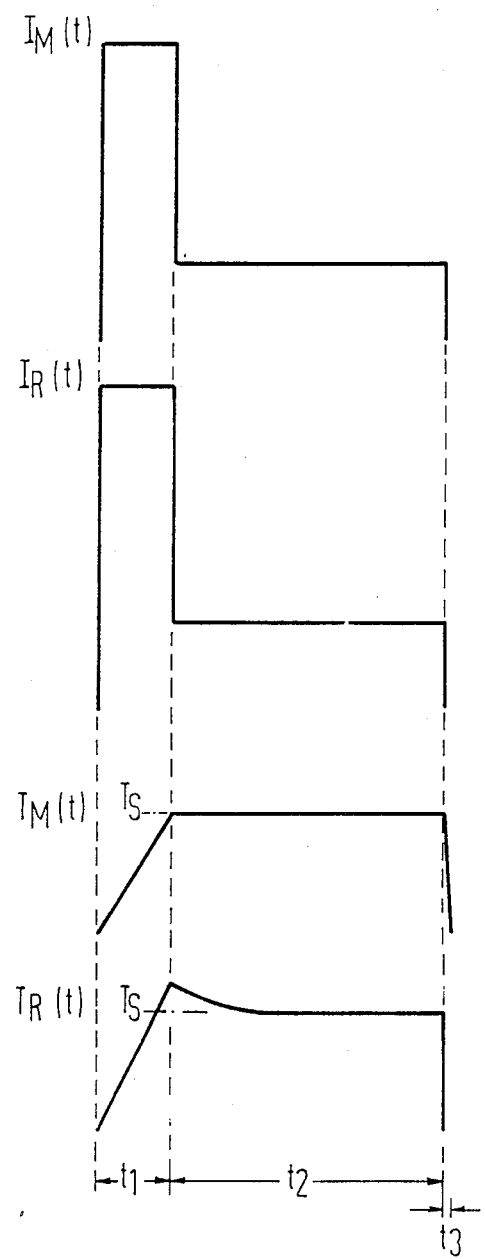
FIG. 4 comprises curves dotted against time showing intensity and temperature.
Figure 5:
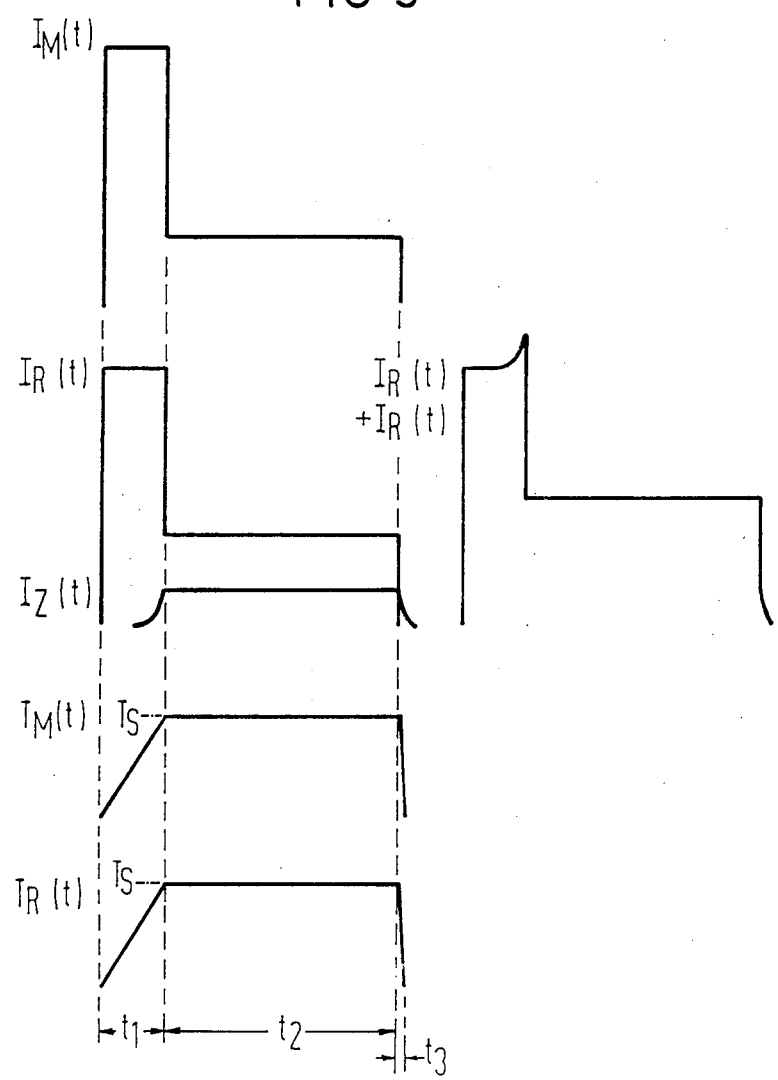
FIG. 5 illustrates curves showing irradiation and temperature in the invention.

FIG. 5 illustrates a method of the invention for rapidly thermally processing a semiconductor wafer which has a tempering process with a short heat-up time $t_1$ followed by a tempering time $t_2$ during which the entire semiconductor wafer should have a constant temperature, and then followed by a short cooling time $t_3$.

The upper side surface of the semiconductor wafer is irradiated over its surface with a main irradiation arrangement. The intensity $I_M$ in the region of the center of the semiconductor wafer is identical to the intensity $I_R$ in the region of the edges of the semiconductor wafer.

For compensating the radiation of heat which occurs very rapidly at the edges of the semiconductor wafer, an additional electromagnetic radiation is directed onto the edge regions of the semiconductor wafer, and its intensity $I_Z$ is varied as a function of time so that the temperature $T_R$ in the regions of the edges of the semiconductor wafer is equal to the temperature $T_M$ in the region of the center of the semiconductor wafer during the entire tempering process. The curve for the intensity $I_Z$ of the additional irradiation is dependent on the curve of the intensities $I_M$, $I_R$ of the main irradiation arrangement. When, after the heat-up time $t_1$, an equilibrium has been established between the energy absorbed by the semiconductor wafer and the energy radiated out from the semiconductor wafer, the radiation intensities $I_M$, $I_R$ and $I_Z$ can be kept constant in order to obtain an identical, constant rated temperature $T_S$ in the region of the center of the semiconductor wafer and in the regions of the edges of the semiconductor wafer.

So that the cooling rates in the region of the center of the semiconductor wafer and in the regions of the edges of the semiconductor wafer are identical during the cooling time $t_3$ after the main irradiation ($I_M = I_R = 0$) have been shut off, the additional irradiation $I_Z$ is slowly varied down to zero after the tempering time $t_2$.

A comparison of the radiant intensity $I_M$ of the irradiation in the region of the center of the semiconductor wafer to the overall radiant intensity $I_R + I_Z$ in the region of the edges of the semiconductor wafer shows that the relative intensity distribution of the electromagnetic irradiation in the method of the invention varies as a function of time over the semiconductor wafer.

The curves shown in the figure are valid for a typical tempering cycle having a heating rate of 300° C. per second to 1100° C., a tempering time of 5 seconds at 1100° C. and a cooling phase by natural radiation of heat.

Figure 6:
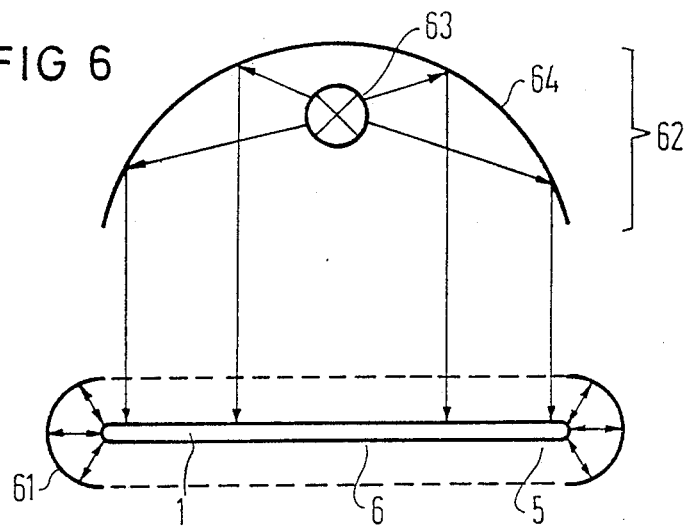
FIG. 6 illustrates in section an apparatus of the invention.

See FIG. 6. So as to compensate the radiation of heat that occurs to an increased degree in the edge regions 5 of the semiconductor wafer 1, a reflection screen 61 which has side walls formed into an arc or which is semicircularly shaped in cross section can be arranged around the edges of the semiconductor wafer 1 such that the radiation of heat from the edges 5 of the semiconductor wafer is again reflected back to the wafer. The radiation of heat at the edges 5 of the semiconductor wafer is thus compensated in a self-regulating manner at all times. The reflection screen 61 is made of a highly reflective material and can, for example, be manufactured of metal.

An arc discharge lamp 63 can serve as the main irradiation arrangement 62 with an arced shaped reflector 64 being arranged as shown and dimensioned such that the upper side of the semiconductor wafer 1 is irradiated with identical intensity over its entire surface.

The arrows in FIG. 6 schematically indicate the radiation paths.

As shown in FIG. 7 in addition to the main irradiation arrangement 62 shown in FIG. 6, an annular light source 71 is mounted around the edges 5 of the semiconductor wafer 1. An annular reflector 72 with a parabolic cross section surrounds the annular light source 71. The control of the intensities $I_M$ and $I_R$ of the main irradiation arrangement 62 and the control of the intensity $I_Z$ of the annular light source 71 is done by making temperature measurements in the region of the center of the semiconductor wafer and in the region of the edges of the semiconductor wafer. The intensity $I_Z$ of the irradiation of the light source 71 is controlled on the basis of the detected temperature differences between the center 6 of the semiconductor wafer and the edges 5 of the semiconductor wafer. The temperature measurements, for example, are made by an edge mounted pyrometer 73 and a center mounted pyrometer 74 which are suitable for the temperature ranges under consideration and which are gentle on the sensitive semiconductor wafer 1 due to the non-contacting measuring principle. A difference measuring device receives inputs from pyrometers 73 and 74 and produces an output signal proportional to the temperature difference. A power control 100 receives the output of the difference measuring device 90 and controls the power to light source 71.

FIG. 8 is a plan view of FIG. 7. The annular light source 71, for example, a tungsten lamp, and the reflector with a parabolic cross section 72 are concentrically arranged around the edges 5 of the semiconductor wafer 1.

Figure 9:
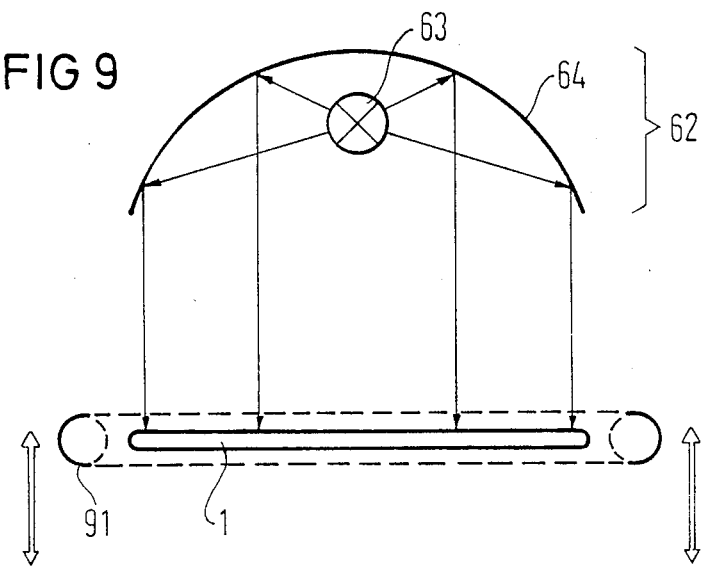
FIG. 9 illustrates in section a further embodiment of the invention.

FIG. 9 is a further development of the method of the invention which has an annular heat radiator 91 arranged around the edges of the semiconductor wafer 1 for compensating for the radiation of heat at an increased amount at the edge regions of the semiconductor wafer 1. Heat radiator 91 may, for example, contain silicon carbide which produces a silicon-like emissivity. The control of the intensity $I_Z$ of the additional irradiation is done with pyrometer measurements in the region of the center 6 of the semiconductor wafer and in the regions of the edges 5 of the semiconductor wafer, as shown in FIG. 7.

A further possibility for the time-dependent adjustment of the intensity $I_Z$ of the additional irradiation is that the spacing of the annular heat radiator 91 from the semiconductor wafer 1 can be modified by moving the heat radiator 91 perpendicularly to the surface of the semiconductor wafer as indicated by the double arrows.

The main irradiation arrangement 62 is similar to that of FIG. 6.

Figure 10:
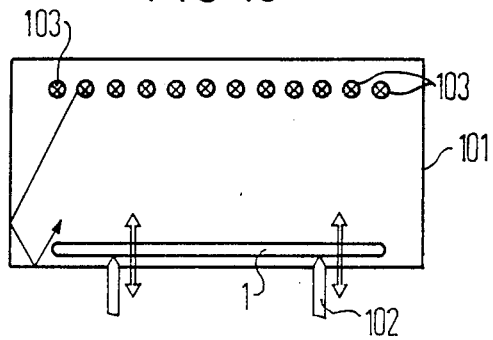
FIG. 10 illustrates a modification of the invention.
Figure 11:
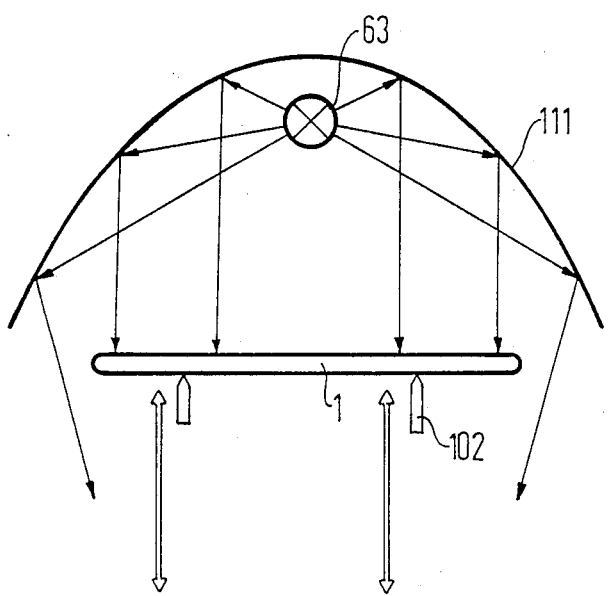
FIG. 11 illustrates a further modification of the invention.

FIGS. 10 and 11 illustrate a further development of the invention wherein an irradiation source 103 or 62 and reflectors 101 and 111 are arranged above the semiconductor wafer 1 as a main irradiation arrangement which is designed such that the upper side of the semiconductor wafer is irradiated over its surface with identical intensity $I_M$, $I_R$ with a defined spacing of the semiconductor wafer 1 from the reflectors 101 and 111. The semiconductor wafer 1 is held in a mobile manner, for example, with quartz pins 102. The reflectors 101 and 111 are formed such that the radiation incident on the edge regions of the semiconductor wafer has a greater intensity than the radiation incident on the central region of the semiconductor wafer when the distance of the semiconductor wafer 1 from the radiation sources 103 and 63 are varied in a defined direction. The increased radiation of heat occurring at the edge regions of the semiconductor wafer 1 can thus be compensated for by moving the semiconductor wafer 1 as indicated by the double arrows. The position of the semiconductor wafer 1 is controlled by pyrometer measurements, as set forth with reference to the FIG. 7 embodiment.

A rectangularly shaped reflection chamber 101 can be used as the reflector which entirely encloses the semiconductor wafer 1 and the irradiation source can be a plurality of light sources 103, for example, tungsten lamps as shown in FIG. 10.

As shown in FIG. 11, a single irradiation source 63 comprising an arced shaped reflector 111 which spans around the irradiation source 63 and the semiconductor wafer 1 can be used as the main irradiation source with the dimensions being selected such that a corresponding, distance-dependent intensity distribution of the irradiation is achieved.

The invention also comprises methods wherein the under side or the upper side of the semiconductor wafer are irradiated by a main irradiation arrangement.

The control of the intensity $I_Z$ of the additional irradiation can also occur by using pre-calculated curves of the required intensity values.

The method of the invention can be employed at all usable temperatures and can also be utilized in multistage tempering cycles.

Although the application has been described with respect to preferred embodiments, it is not to be so limited as changes and modifications can be made which are within the scope of the appended claims.

I claim as my invention:

1. A method for rapidly thermal processing a semiconductor wafer with electromagnetic irradiation with a main irradiation arrangement that comprises at least one radiation source and which transmits the majority part of the energy required for heating the semiconductor wafer, comprising the steps of:
   (a) irradiating with a main irradiation arrangement (62) said semiconductor wafer (1) on at least one side such that the intensities ($I_M$, $I_R$) of the radiation directed onto the central region (6) of the semiconductor wafer (1) and onto the edge regions of the semiconductor wafer (1) are identical; and
   (b) irradiating with additional electromagnetic radiation which heats the semiconductor wafer (1) at the edge regions (5) and the intensity ($I_7$) of such additional electromagnetic radiation varied as a function of time such that the temperatures ($T_M$, $T_r$) in the central region (6) and in the edge regions (5) of the semiconductor wafer (1) are identical during the entire tempering process, and comprising the step of placing a screen (61) which has a hemispherically shaped cross section around the edges of the semiconductor wafer (1) such that the radiation of heat from the edges (5) of the semiconductor wafer are reflected back by the reflection screen (61) so that the radiation from the edges is compensated.

2. A method according to claim 1, comprising the step of placing an annular light source (71) and a reflector (72) which surrounds the annular light source (71) around the edges of the semiconductor wafer.

3. A method according to claim 1, comprising the step of placing an annular heat radiator (91) around the edges of the semiconductor wafer (1).

4. A method according to claim 3, comprising the step of varying the radiant intensity ($I_Z$) of the annular heat radiator (91) by moving the heat radiator (91) perpendicularly relative to the surface of the semiconductor wafer (1), whereby the distance of the heat radiator (91) from the edge of the semiconductor wafer (1) is varied.

5. A method for rapidly thermal processing a semiconductor wafer with electromagnetic irradiation with a main irradiation arrangement that comprises at least one radiation source and which transmits the majority part of the energy required for heating the semiconductor wafer, comprising the steps of:

(a) irradiating with a main irradiation arrangement (62) said semiconductor wafer (1) on at least one side such that the intensities ($I_M$, $I_R$) of the radiation directed onto the central region (6) of the semiconductor wafer (1) are identical; and (b) irradiating with additional electromagnetic radiation which heat the semiconductor wafer (1) at the edge regions (5) and the intensity ($I_Z$) of such additional electromagnetic radiation varied as a function of time such that the temperatures ($T_M$, $T_R$) in the central region (6) and in the edge regions (5) of the semiconductor wafer (1) are identical during the entire tempering process, and comprising the steps of: a reflector (101, 111) over the semiconductor wafer (1) as a main irradiation arrangement, such that with a given defined distance of the semiconductor wafer (1) from the reflector (101, 111), the semiconductor wafer (1) is irradiated such that the intensities ($I_M$, $I_R$) of the radiation incident on the central region (6) and on the edge regions (5) are identical and for a different distance of the semiconductor wafer (1) from the reflector (101, 111), the intensity ($I_R + I_Z$) of the radiation incident on the edge regions (5) of the semiconductor wafer is greater than the intensity ($I_M$) of the radiation incident on the central region (6) of the semiconductor wafer (1); and (b) by varying for compensating the radiation of heat occurring to an increased degree in the edge regions (5) of the semiconductor wafer (1), the intensity ($I_R + I_Z$) of the radiation incident on the edge regions (5) of the semiconductor wafer (1) the distance of the semiconductor wafer (1) from the reflector (101, 111) is varied.

6. A method according to claim 5, comprising the steps of using a main irradiation arrangement (62) that is composed of a plurality of light sources (103) arranged side-by-side parallel to the surface of the semiconductor wafer (1) and a reflection chamber (101) is used as the reflector, and the reflection chamber entirely encloses the semiconductor wafer (1) and the light sources (103).

7. A method according to claim 5, comprising the steps of using irradiation source (63) as the main irradiation arrangement and an arced reflector (111) which spans the semiconductor wafer (1) and the irradiation source (63) is used and the dimensions of the reflector (111) are selected such that a corresponding, distance-dependent intensity distribution of the irradiation is achieved.

8. A method according to claim 1 or 2 or 3 or 4 or 5 or 6, wherein the time variation of the intensity ($I_Z$) of the additional radiation which is directed onto the edge regions (5) of the semiconductor wafer (1) is controlled by making temperature measurements at the edges (5) of the semiconductor wafer and at the center (6) of the semiconductor wafer.

9. A method according to claim 1 or 2 or 3 or 4 or 5 or 6, wherein the time variations of the intensity ($I_Z$) of the additional radiation which is directed onto the edge regions (5) of the semiconductor wafer (1) is controlled by using pre-calculated curves of the required intensity values.

10. A method according to claim 8, wherein the temperature measurements are made with pyrometers (73, 74).

* * * * *